United States Patent
Marubayashi et al.

(10) Patent No.: US 8,070,880 B2
(45) Date of Patent: Dec. 6, 2011

(54) SUBSTRATE PROCESSING APPARATUS

(75) Inventors: Tetsuya Marubayashi, Toyama (JP);
Yasuhiro Inokuchi, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 637 days.

(21) Appl. No.: 12/255,246

(22) Filed: Oct. 21, 2008

(65) Prior Publication Data
US 2009/0116936 A1 May 7, 2009

(30) Foreign Application Priority Data

Oct. 22, 2007 (JP) ................................. 2007-274005
Aug. 25, 2008 (JP) ................................. 2008-215943

(51) Int. Cl.
*C23C 16/455* (2006.01)
*C23C 16/458* (2006.01)
*C23C 16/46* (2006.01)
*C23F 1/00* (2006.01)
*H01L 21/306* (2006.01)
*C23C 16/06* (2006.01)
*C23C 16/22* (2006.01)

(52) U.S. Cl. .............. 118/719; 156/345.31; 156/345.33; 156/345.24; 156/345.27; 118/725

(58) Field of Classification Search ................... 118/719, 118/725; 156/345.31, 345.33, 345.24, 345.27
See application file for complete search history.

(56) References Cited

U.S. PATENT DOCUMENTS

| 5,441,570 A | * | 8/1995 | Hwang | 118/725 |
| 5,632,820 A | * | 5/1997 | Taniyama et al. | 118/724 |
| 2009/0116936 A1 | * | 5/2009 | Marubayashi et al. | 414/148 |
| 2010/0199914 A1 | * | 8/2010 | Iza | 118/725 |

FOREIGN PATENT DOCUMENTS

| JP | 4-206718 | | 7/1992 |
| JP | 9-260298 | | 10/1997 |
| JP | 2006-13105 | | 1/2006 |
| JP | 2007-266118 | | 10/2007 |
| JP | 2009124105 A | * | 6/2009 |

* cited by examiner

*Primary Examiner* — Rudy Zervigon
(74) *Attorney, Agent, or Firm* — Brundidge & Stanger, P.C.

(57) ABSTRACT

Provided is a substrate processing apparatus. The substrate processing apparatus includes a reaction tube, a substrate holder, a gas nozzle, a heating unit, a temperature detector, and an exhaust unit. The reaction tube accommodates and processes substrates. The substrate holder holds substrates stacked at predetermined intervals in the reaction tube. The gas nozzle is installed along a stacked direction of the substrates. The heating unit heats the substrates. The temperature detector is installed along the stacked direction of the substrates. The exhaust unit exhausts an inside atmosphere of the reaction tube. Each of the gas nozzle and the temperature detector includes first and second parts and is supported by a narrow tube supporting member including first and second supporting parts. The first supporting part makes contact with the first part. The second supporting part is parallel with the second part and supports the second part.

17 Claims, 11 Drawing Sheets

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2007-274005, filed on Oct. 22, 2007, and 2008-215943, filed on Aug. 25, 2008, in the Japanese Patent Office, the entire contents of which are hereby incorporated by reference.

BACKGROUND OF THE INVENTION

1. Field of the Invention

The present invention relates to a substrate processing apparatus for performing a process, such as a thin film forming process, an oxidation process, a diffusion process, an annealing process, and an etching process, on a substrate such as a silicon wafer.

2. Description of the Prior Art

Examples of substrate processing apparatuses include a single wafer type substrate processing apparatus configured to process substrates one by one and a batch type substrate processing apparatus configured to process a predetermined number of substrates at a time.

A batch type substrate processing apparatus includes a vertical furnace, and a predetermined number of substrates are processed in a processing chamber of the vertical furnace.

A reaction tube defining the processing chamber of the vertical furnace has an opened tube shape and is provided with a heating device disposed around the reaction tube. In the processing chamber, substrates are horizontally held in multiple stages by a substrate holder (boat), and a predetermined process is performed on the surfaces of the substrates by controlling the pressure of the processing chamber to a predetermined processing pressure, heating the processing chamber to a predetermined temperature, and introducing and exhausting a processing gas into and from the processing chamber.

A gas nozzle used for supplying a processing gas to the processing chamber is erected along a wall of the reaction tube, and a temperature detector used for detecting the temperature of the processing chamber is also erected along the wall of the processing chamber.

In the related art, the gas nozzle and the temperature detector are installed in a manner such that the gas nozzle and the temperature detector are inserted horizontally through a lower part of the reaction tube, bent upwardly in a vertical direction, and extended along the wall of the reaction tube.

FIG. 14 illustrates a supporting structure for a gas nozzle and a temperature detector of a conventional substrate processing apparatus.

A reaction tube 1 is installed coaxially with a short cylindrical inlet flange 2, a seal such as an O-ring 3 is disposed between the inlet flange 2 and the reaction tube 1, and a joint between the reaction tube 1 and the inlet flange 2 is securely sealed. The inlet flange 2 is supported by a structural member 4 such as a top plate of a loadlock chamber, an O-ring 5 is disposed between the structural member 4 and the inlet flange 2, and the inlet flange 2 and the structural member 4 are air-tightly joined.

A lower opening of the inlet flange 2 forms a furnace throat 6, and a boat 7 is loaded into and unloaded from a processing chamber 8 through the furnace throat 6 by a boat elevator (not shown). After the boat 7 is placed in the processing chamber 8, the furnace throat 6 is air-tightly sealed by a seal cap 9.

In FIG. 14, reference numeral 11 denotes a gas nozzle, and reference numeral 12 denotes a temperature detector.

In the temperature detector 12, a plurality of thermocouples are inserted in a protective tube made of a material such as quartz. Thermocouples are supported in the protective tube at different heights so as to be used for detecting temperatures of a plurality of positions inside the processing chamber 8. The gas nozzle 11 is configured by a tube such as a quartz tube.

Both of the gas nozzle 11 and the temperature detector 12 are configured such that vertical loads acting on parts of the gas nozzle 11 and the temperature detector 12 inserted through the inlet flange 2 are supported by narrow tube supporting members 13 and 14.

The narrow tube supporting members 13 and 14 have the same structure, and thus only the narrow tube supporting member 13 will be explained in the following description.

An inner flange 15 protrudes from a lower inner surface of the inlet flange 2 toward the center of the inlet flange 2, an adjustment bolt 16 is inserted through the inner flange 15 in a vertical direction, and the adjustment bolt 16 is fixed by a lock nut 17. At an upper end of the adjustment bolt 16, a nozzle receiving flange 18 is installed, and the nozzle receiving flange 18 is configured such that the center of the nozzle receiving flange 18 is brought contact with a leading end of a horizontal part 11a of the gas nozzle 11 from the bottom side of the leading end of the horizontal part 11a.

Furthermore, at the horizontal part 11a, a flexible seal ring (not shown) is fitted, and a fastener such as a nut is used to press the seal ring against the horizontal part 11a, such that a penetration part of the horizontal part 11a can be air-tightly sealed and the horizontal part 11a can be fixed to the inlet flange 2 by the pressing force of the nut.

In the conventional substrate processing apparatus, the supporting structure for the gas nozzle 11 and the temperature detector 12 is required to support the gas nozzle 11 and the temperature detector 12 along the inner wall of the reaction tube 1 to prevent falling of the gas nozzle 11 and the temperature detector 12.

Therefore, the height of the nozzle receiving flange 18 is adjusted in a manner such that a vertical part 11b of the gas nozzle 11 can be positioned vertically along the inner wall of the reaction tube 1.

However, if the inside of the reaction tube 1 is decompressed, a compressing force is applied to the O-ring 3, and thus the O-ring 3 is compressed. In this case, if the O-ring 3 is not uniformly compressed along its circumference, the reaction tube 1 inclines with respect to the inlet flange 2.

Accordingly, a horizontal load is applied to vertical parts of the gas nozzle 11 and the temperature detector 12 that are installed along the inner wall of the reaction tube 1, and thus penetrated parts of the inlet flange 2 can be damaged.

Furthermore, if the inside of the reaction tube 1 is decompressed, horizontal forces are applied to horizontal parts of the gas nozzle 11 and the temperature detector 12 in a direction toward the center of the reaction tube 1, and since parts of the horizontal parts inserted through the inlet flange 2 are fixed by friction, the gas nozzle 11 and the temperature detector 12 can be inwardly slid. This causes problems in that the vertical parts of the gas nozzle 11 and the temperature detector 12 are dislocated away from the inner wall of the reaction tube 1 and are thus supported in an unstable state.

SUMMARY OF THE INVENTION

An object of the present invention is to provide a substrate processing apparatus, in which undesired loads are not applied to penetration parts of a gas nozzle and a temperature detector even when a reaction tube is inclined so that damages can be prevented, and the penetration parts can be firmly fixed for preventing slippage and supporting the gas nozzle and the temperature detector securely and stably.

According to an aspect of the present invention, there is provided a substrate processing apparatus including: a reaction tube configured to accommodate and process substrates; a substrate holder configured to hold a plurality of substrates stacked at predetermined intervals in the reaction tube; a gas nozzle installed along a stacked direction of the substrates so as to supply a predetermined processing gas to the reaction tube; a heating unit configured to heat the substrates; a temperature detector installed along the stacked direction of the substrates; and an exhaust unit configured to exhaust an inside atmosphere of the reaction tube, wherein each of the gas nozzle and the temperature detector includes a first part inserted into the reaction tube and parallel with surfaces of the stacked substrates and a second part extending from the first part along an inner wall surface of the reaction tube in the stacked direction of the substrates, and each of the gas nozzle and the temperature detector is supported by a narrow tube supporting member including a first supporting part and a second supporting part, wherein the first supporting part is in contact with the first part, and the second supporting part is parallel with the second part and is configured to support the second part in at least three directions.

DETAILED DESCRIPTION OF THE PREFERRED EMBODIMENTS

Preferable embodiments of the present invention will be described hereinafter with reference to the attached drawings.

Figure 1:
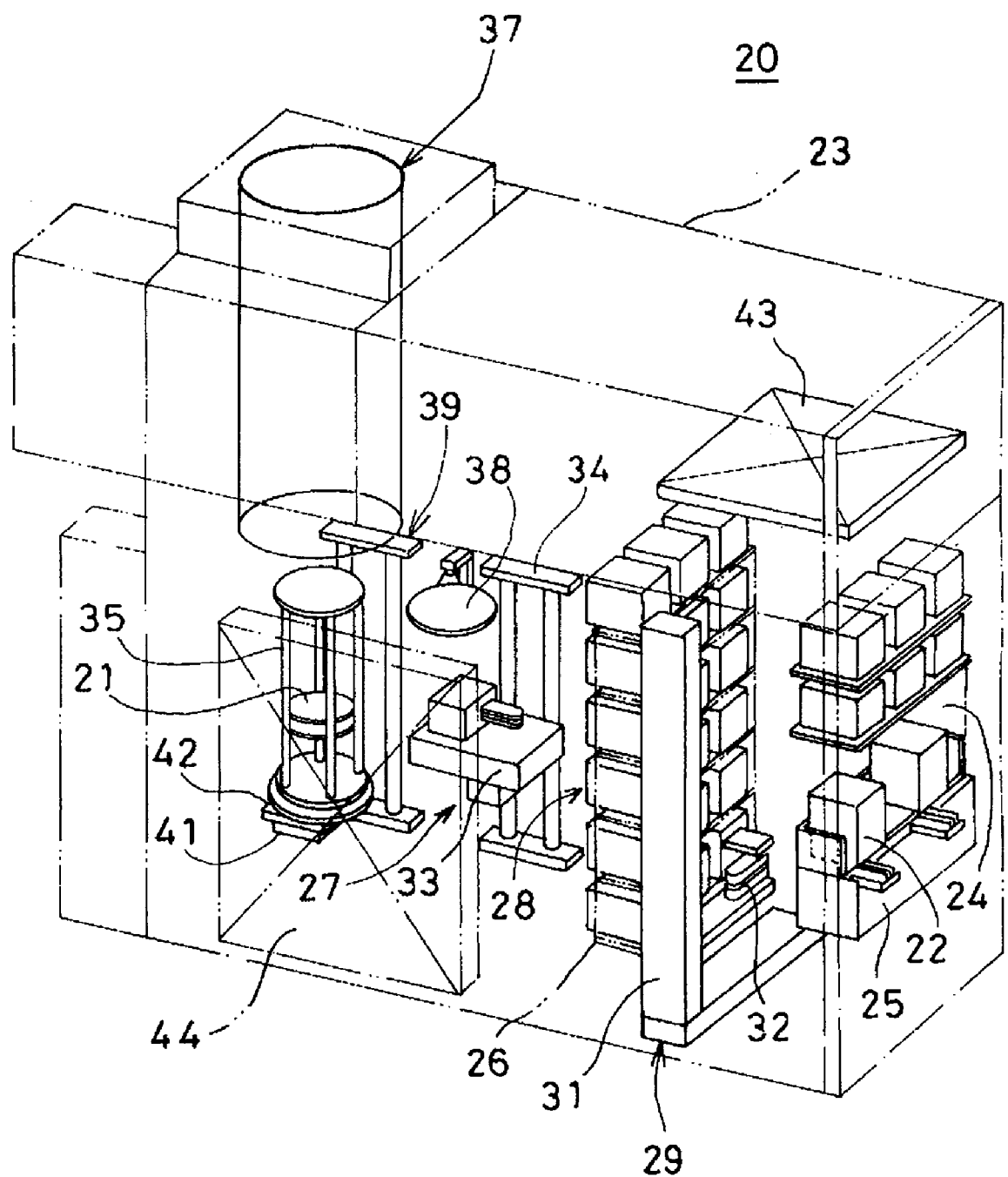
FIG. 1 is a perspective view illustrating a substrate processing apparatus in accordance with an embodiment of the present invention.

First, an example of a substrate processing apparatus of the present invention will be explained with reference to FIG. 1.

Figure 14:
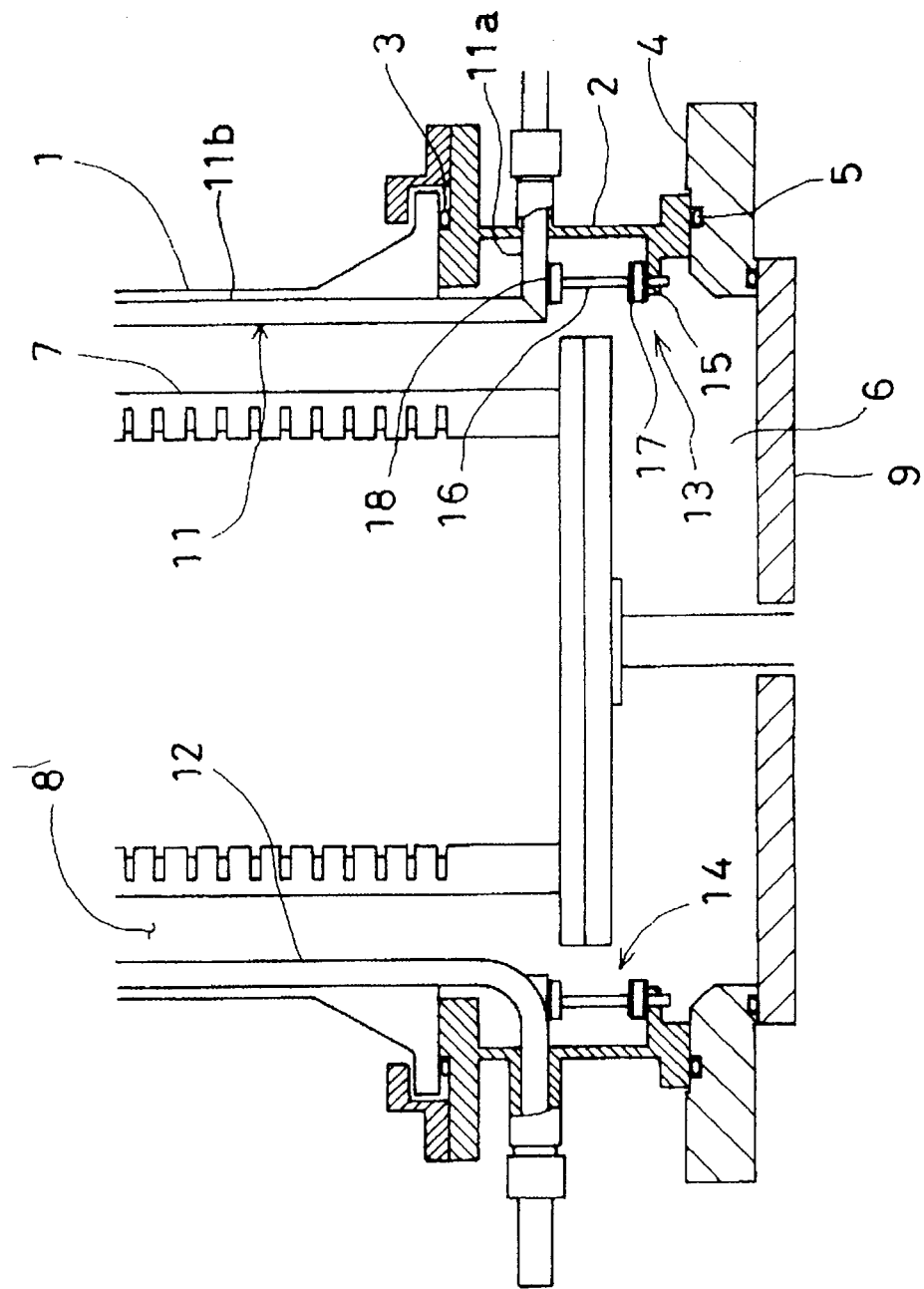
FIG. 14 is a sectional view illustrating a furnace throat part of a conventional substrate processing apparatus.

In the following description, a vertical substrate processing apparatus configured to perform a process such as oxidation, diffusion, or chemical vapor deposition (CVD) will be explained as an example of the substrate processing apparatus. In FIG. 1 and FIG. 14, like reference numerals denote like elements.

In a substrate processing apparatus 20 of the present invention, wafers 21 made of a material such as silicon is carried in a state where the wafers 21 are charged in a cassette 22 used as a substrate container.

In the drawing, reference numeral 23 denotes a housing, and at the front side of the housing 23, a cassette carrying in/out opening 24 is installed to allow access between the inside and outside of the housing 23. The cassette carrying in/out opening 24 is configured to be closed and opened by a front shutter (not shown).

Near the cassette carrying in/out opening 24, a cassette stage 25 (substrate container transferring stage) is installed. The cassettes 22 are designed to be carried to and from the cassette stage 25 by an in-plant carrying unit (not shown).

The carrying unit places the cassettes 22 on the cassette stage 25 with wafers 21 in the cassettes 22 being in an upright position and wafer carrying in/out openings of the cassettes 22 facing upward. The cassette stage 25 is configured so that the cassette 22 is rotated 90 degrees counterclockwise in a longitudinal direction to the backward of the housing 23 in order to make the wafers 21 of the cassette 22 positioned horizontally and point the wafer carrying in/out opening of the cassette 22 toward the backward of the housing 23.

At nearly the center portion inside the housing 23 in a front-to-back direction, a cassette shelf 26 (substrate container shelf) is installed to store a plurality of cassettes 22 in a plurality of steps and a plurality of rows. At the cassette shelf 26, a transfer shelf 28 is installed to store cassettes 22 to be carried by a wafer transfer mechanism 27 (substrate transfer mechanism).

In addition, at the upside of the cassette stage 25, a standby cassette shelf (not shown) is installed to store a standby cassette 22.

Between the cassette stage 25 and the cassette shelf 26, a cassette carrying unit 29 (substrate container carrying unit) is installed. The cassette carrying unit 29 is configured by a cassette elevator 31 (substrate container lifting mechanism), which is capable of holding and moving the cassette 22 upward and downward, and a cassette carrying mechanism 32 (substrate container carrying mechanism) as a horizontal carrying mechanism. The cassette carrying unit 29 is designed to carry the cassette 22 in and out of the cassette stage 25, the cassette shelf 26, and/or the standby cassette shelf (not shown) by cooperative motions of the cassette elevator 31 and the cassette transfer mechanism 32.

At the rear of the cassette shelf 26, a wafer transfer mechanism 27 is installed. The wafer transfer mechanism 27 is configured by a wafer transfer unit 33 (substrate transfer unit) capable of rotating or linearly moving the wafer 21 in a horizontal direction, and a wafer transfer unit elevator 34 (substrate transfer unit lifting mechanism) used to move the wafer transfer unit 33 upward and downward. By cooperative operations of the wafer transfer unit elevator 34 and the wafer transfer unit 33, the wafer 21 is charged to a boat 35 and discharged from the boat 35.

At the inner rear portion of the housing 23, an airtight, pressure-resistant loadlock chamber 71 (described later) is installed, and at the upside of the loadlock chamber 71, a processing furnace 37 is installed. The lower end of the processing furnace 37 is opened as a furnace throat, and the furnace throat is configured to be opened and closed by a furnace throat shutter 38 (furnace throat opening/closing mechanism).

Inside the loadlock chamber 71, a boat elevator 39 (substrate holder lifting mechanism) is installed as a lifting mechanism for moving the boat 35 upward and downward to load/unload the boat 35 to/from the processing furnace 37; a boat arm 41 extends horizontally from the boat elevator 39; a seal cap 42 is installed at the boat arm 41 for air-tightly closing the furnace throat; and the boat 35 is vertically placed on the seal cap 42.

The boat 35 is made of a material such as quartz so as not to contaminate wafers 21 and is configured to hold wafers 21 horizontally in multiple stages.

At the upside of the cassette shelf 26, a cleaning unit 43 including a supply fan and a dust filter is installed to supply purified clean air. The cleaning unit 43 is configured to supply clean air to the inside of the housing 23.

Another cleaning unit 44 including a supply fan and a dust filter is installed at a position facing the wafer transfer unit elevator 34 to supply clean air in a direction toward the wafer transfer unit elevator 34. Clean air supplied from the cleaning unit 44 flows through the wafer transfer unit 33 and the boat 35 and is discharged from the housing 23 through an exhaust unit (not shown).

An exemplary operation of the substrate processing apparatus will be described hereinafter in accordance with the present invention.

The cassette carrying in/out opening 24 is opened using a front cap (not shown). Then, cassettes 22 are introduced through the cassette carrying in/out opening 24 and are placed on the cassette stage 25 with wafers 21 of the cassettes 22 being in an upright position and the wafer carrying in/out openings of the cassettes 22 facing upward. The cassette stage 25 orients the cassettes 22 in a manner such that the cassettes 22 are positioned horizontally and the wafer carrying in/out openings of the cassettes 22 are pointed toward the backward of the housing 23.

The cassette carrying unit 29 carries the cassettes 22 to destined positions of the cassette shelf 26 or the standby cassette shelf (not shown). The cassettes 22 are temporarily stored on the cassette shelf 26 or the standby cassette shelf (not shown) and are carried to the transfer shelf 28 by the cassette carrying unit 29, or the cassettes 22 are carried from the cassette stage 25 directly to the transfer shelf 28.

After the cassettes 22 are transferred to the transfer shelf 28, a wafer 21 of the cassette 22 is charged by the wafer transfer unit 33 into the boat 35 that is placed in a lower position. Thereafter, the wafer transfer unit 33 is moved back to the cassette 22 to charge the next wafer 21 into the boat 35.

After a predetermined number of wafers 21 are charged into the boat 35, the furnace throat shutter 38 is opened. Then, the boat 35 in which the wafers 21 are held is loaded into the processing furnace 37 as the seal cap 42 is moved upward by the boat elevator 39.

After the boat 35 is loaded, the wafers 21 are processed in the processing furnace 37.

Then, the wafers 21 and the cassettes 22 are unloaded from the housing 23 in a reverse order.

Figure 2:
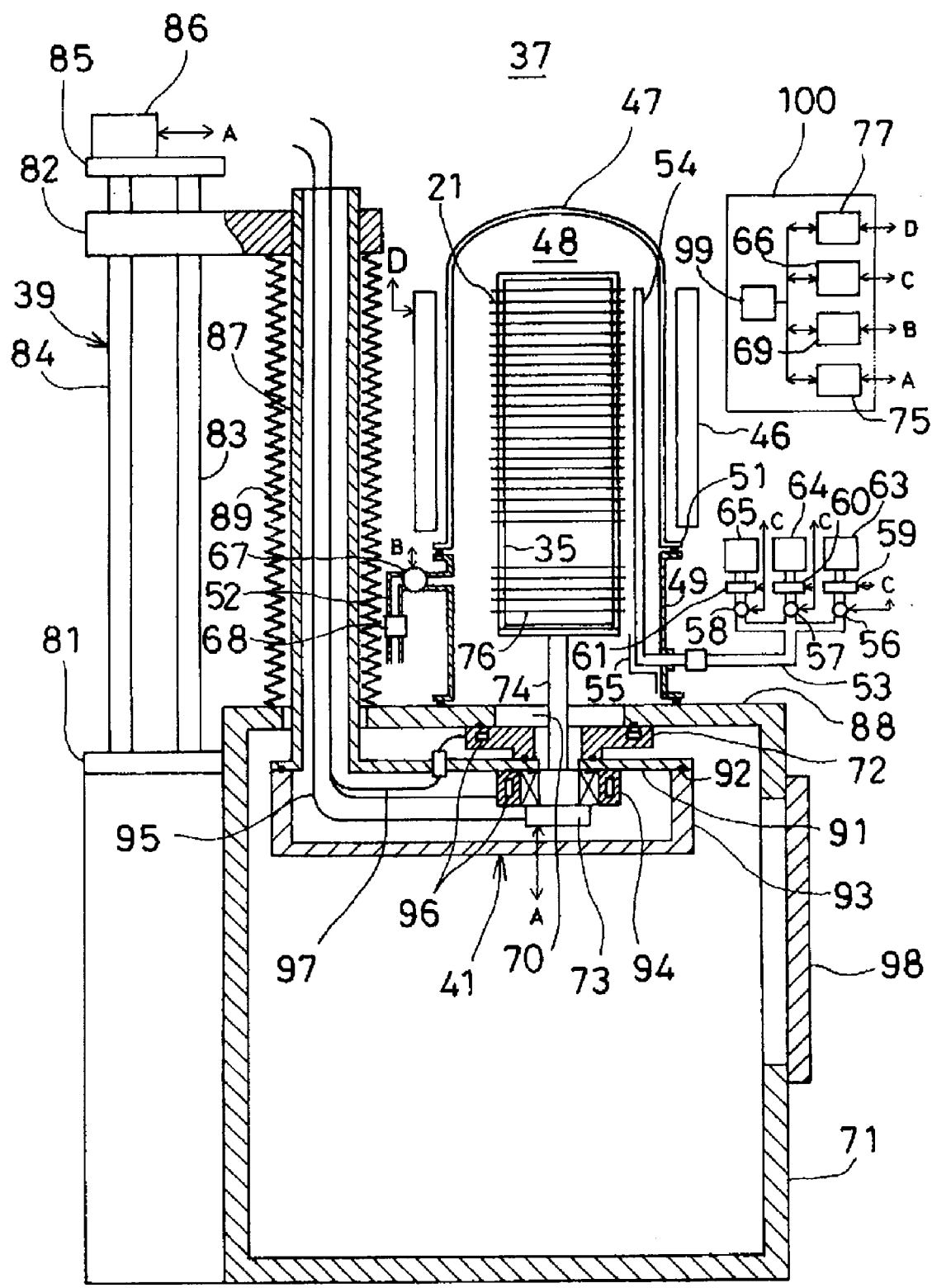
FIG. 2 is a schematic sectional view illustrating a processing furnace of the substrate processing apparatus.

Next, an exemplary structure of the processing furnace 37 used in the substrate processing apparatus 20 will be explained with reference to FIG. 2.

The processing furnace 37 includes a heater 46 as a heating unit. The heater 46 has a cylindrical shape and is configured by a heating wire and an insulating material installed around the heating wire. The heater 46 is vertically supported by a holder (not shown).

A reaction tube 47 is coaxially installed inside the heater 46. The reaction tube 47 is made of a heat-resistant material such as quartz ($SiO_2$) or silicon carbide (SiC). The reaction tube 47 has a hollow cylindrical shape with a closed upper end and an opened lower end.

Inside the reaction tube 47, a processing chamber 48 is defined. The processing chamber 48 accommodates the boat 35.

An inlet flange 49 is coaxially installed under the reaction tube 47. For example, the inlet flange 49 is made of stainless steel and has a cylindrical shape with opened upper and lower ends.

The inlet flange 49 is installed at a top plate of the loadlock chamber 71, and the reaction tube 47 stands on the inlet flange 49. Between the inlet flange 49 and the reaction tube 47, an O-ring 51 is installed as a seal. A reaction chamber is formed by the reaction tube 47 and the inlet flange 49.

At the inlet flange 49, a gas exhaust pipe 52 as well as a gas supply pipe 53 is installed, and at the gas supply pipe 53, a gas nozzle 54 is connected. The gas nozzle 54 includes a vertical part extending vertically along an inner wall of the reaction tube 47, and a horizontal part passing through the inlet flange 49 horizontally. A lower end part of the gas nozzle 54 is supported by a narrow tube supporting member 55 installed at the inlet flange 49.

Although now shown, a temperature detector (described later) is installed in a manner such that the temperature detector passes through the inlet flange 49 horizontally and extends vertically along the inner wall of the reaction tube 47, in order to detect the temperature of the processing chamber 48.

The gas supply pipe 53 is divided into three branches at an upstream side, and the three branches are respectively connected to a first gas supply source 63, a second gas supply source 64, and a third gas supply source 65 through vales 56, 57, and 58, and mass flow controllers (MFCs) 59, 60, and 61 used as gas flow rate control devices.

A gas flow controller 66 is electrically connected to the MFCs 59 to 61, and the valves 56 to 58, so as to supply desired amounts of gas at desired time.

A vacuum exhaust unit 68 such as a vacuum pump is connected to a downstream side of the gas exhaust pipe 52 through a pressure sensor (not shown) and an automatic pressure controller (APC) valve 67 used as a pressure regulator. The pressure sensor and the APC valve 67 are electrically connected to a pressure controller 69, and the pressure controller 69 is configured to control the APC valve 67 based on a pressure detected by the pressure sensor for adjusting the pressure inside the processing chamber 48 to a desired level at a desired time.

The inlet flange 49 is air-tightly extended from the top surface of the loadlock chamber 71, and an opening which communicates with the inlet flange 49 is formed in the top plate of the loadlock chamber 71. A furnace throat 70 is formed by the opening of the top plate of the loadlock chamber 71 and the opened lower end of the inlet flange 49.

The furnace throat 70 is air-tightly closed by an openable seal cap 72. For example, the seal cap 72 is made of stainless steel and has a disk shape. At the top surface of the seal cap 72, an O-ring is disposed as a seal in contact with the bottom surface of the furnace throat 70.

At the seal cap 72, a rotating mechanism 73 is installed. A rotation shaft 74 of the rotating mechanism 73 is connected to the boat 35 through the seal cap 72 to rotate the boat 35 to rotate wafers 21 charged inside the boat 35.

The seal cap 72 is configured to be moved vertically by the boat elevator 39 installed outside the processing furnace 37 as a lifting mechanism so that the boat 35 can be loaded into and unloaded from the processing chamber 48. A driving controller 75 is electrically connected to the rotating mechanism 73 and the boat elevator 39 to control a predetermined operation at a desired time.

The boat 35 is made of a heat resistant material such as quartz or silicon carbide and is configured to hold a plurality of horizontally oriented wafers 21 in multiple stages with centers of the wafers 21 being aligned with each other. At a lower part of the boat 35, a plurality of heat resistant members, such as circular heat resistant plates 76 made of a heat resistant material such as quartz or silicon carbide, are horizontally oriented in multiple stages to decrease heat transfer from the heater 46 to the inlet flange 49.

The heater 46 and the temperature detector are electrically connected to a temperature controller 77, and the power condition of the heater 46 is controlled based on temperature information detected using the temperature detector to maintain the processing chamber 48 at a desired temperature distribution at a desired time.

In the above-described processing furnace 37, a first processing gas is supplied from the first gas supply source 63, and the flow rate of the first processing gas is controlled by the MFC 59. Then, the first processing gas is introduced into the processing chamber 48 by the gas supply pipe 53 through the valve 56. A second processing gas is supplied from the second gas supply source 64, and the flow rate of the second processing gas is controlled by the MFC 60. Then, the second processing gas is introduced into the processing chamber 48 by the gas supply pipe 53 through the valve 57. A third processing gas is supplied from the third gas supply source 65, and the flow rate of the third processing gas is controlled by the MFC 61. Then, the third processing gas is introduced into the processing chamber 48 by the gas supply pipe 53 through the valve 58. The processing gas is discharged from the processing chamber 48 by an exhaust unit such as the vacuum exhaust unit 68 connected to the gas exhaust pipe 52.

Next, an exemplary surrounding structure of the processing furnace of the substrate processing apparatus will be described.

A lower base 81 is installed on an outer side of the loadlock chamber 71 used as an auxiliary chamber. On the lower base 81, a guide shaft 83 and a ball screw 84 are stood, and on the upper ends of the guide shaft 83 and the ball screw 84, an upper base 85 is installed.

A lift plate 82 is slidably fit to the guide shaft 83 and is screw-coupled to the ball screw 84. The ball screw 84 is connected to a lift motor 86 installed at the upper base 85, and the lift plate 82 is moved upward or downward as the ball screw 84 is rotated by the lift motor 86.

On the lift plate 82, a hollow lift shaft 87 is air-tightly erected, and the lift shaft 87 is configured to be moved upward and downward together with the lift plate 82. The lift shaft 87 is movably inserted through the top plate 88 of the loadlock chamber 71, and a penetration hole of the top plate 88 through which the lift shaft 87 is inserted is large enough for preventing the lift shaft 87 from contacting the top plate 88.

Between the loadlock chamber 71 and the lift plate 82, a flexible hollow structure such as a bellows 89 is installed to enclose the lift shaft 87 for sealing the loadlock chamber 71. The bellows 89 is sufficiently expanded and contracted in accordance with a movement of the lift plate 82 and has an inner diameter sufficiently larger than the outer diameter of the lift shaft 87 for preventing contacting with the lift shaft 87 upon expansion or contraction.

At a lower end of the lift shaft 87, the boat arm 41 is horizontally installed.

The boat arm 41 has a hollow structure, and a lift base 91 to which the lower end of the lift shaft 87 is fixed is installed on the top surface of the boat arm 41.

A driver cover 93 is air-tightly coupled to the bottom surface of the lift base 91 with a seal 92 such as an O-ring being interposed therebetween. The lift base 91 and the driver cover 93 constitute the boat arm 41. Therefore, the inside of the boat arm 41 is isolated from the inside atmosphere of the loadlock chamber 71.

The rotating mechanism 73 for the boat 35 is installed inside the boat arm 41, and the surrounding of the rotating mechanism 73 is cooled by a cooling mechanism 94.

Power cables 95 are connected from an upper end of the hollow lift shaft 87 to the rotating mechanism 73 through the hollow lift shaft 87. Cooling passages 96 are formed in the cooling mechanism 94 and the seal cap 72, and a coolant tube 97 is connected from the upper end of the hollow lift shaft 87 to the cooling passages 96 through the hollow lift shaft 87 for supplying cooling water.

As the ball screw 84 rotates upon the driving of the lift motor 82, the boat arm 41 is lifted together with the lift plate 82 and the lift shaft 87.

As the boat arm 41 is lifted, the boat 35 is loaded into the processing chamber 48 through the furnace throat 70, and the seal cap 72 closes the furnace throat 70 air-tightly, so that wafer processing can be started. The boat 35 can be moved down by moving down the boat arm 41. The boat 35 is moved down to a position facing a gate valve 98 installed at a lateral side of the loadlock chamber 71 so that after opening the gate valve 98, wafers can be discharged from the boat 35 using the wafer transfer mechanism 27 (refer to FIG. 1).

The gas flow controller 66, the pressure controller 69, the driving controller 75, and the temperature controller 77 constitute an operation control unit and an input/output unit, and are electrically connected to a main controller 99 which controls the overall operation of the substrate processing apparatus 20. The gas flow controller 66, the pressure controller 69, the driving controller 75, the temperature controller 77, and the main controller 99 constitute a controller 100.

Hereinafter, as a process for fabricating a semiconductor device using the processing furnace 37, a method for forming an epitaxial-SiGe (Epi-SiGe) film on a substrate such as a wafer 21 will be described. In the following description, operations of the elements of the substrate processing apparatus are controlled by the controller 100.

When a predetermined number of wafers 21 are charged to the boat 35, the lift motor 86 rotates the ball screw 84 to move up the boat arm 41 using the lift plate 82 and the lift shaft 87 for loading the boat 35 into the processing chamber 48. After the boat 35 is loaded into the processing chamber 48, the furnace throat 70 is air-tightly sealed by the seal cap 72 and the O-ring.

The inside of the processing chamber 48 is exhausted by the vacuum exhaust unit 68 to form a vacuum at a desired pressure (vacuum degree). At this time, the pressure inside the processing chamber 48 is measured with a pressure sensor, and the APC value 67 is feedback controlled based on the measured pressure. In addition, the processing chamber 48 is heated by the heater 46 to a desired temperature. When the heater 46 heats the processing chamber 48, power to the heater 46 is feedback controlled based on temperature information detected by the temperature detector so as to obtain a desired temperature distribution throughout the processing chamber 48. Thereafter, the rotating mechanism 73 rotates the boat 35 in which the wafers 21 are charged.

The first gas supply source 63, the second gas supply source 64, and the third gas supply source 65 are filled with processing gases such as $SiH_4$ or $Si_2H_6$, $GeH_4$, and $H_2$, respectively. The processing gases are supplied from the gas supply sources 63, 64, and 65. Openings of the MFCs 59, 60, and 61 are adjusted for desired gas flow rates, and then the valves 56, 57, and 58 are opened to introduce the processing gases to the processing chamber 48 from an upper portion of the processing chamber 48 through the gas supply pipe 53. The introduced gases are discharged from the processing chamber 48 through the gas exhaust pipe 52. While the processing gases pass through the processing chamber 48, the processing gases make contact with wafers 21, and thus Epi-SiGe films are deposited on surfaces of the wafers 21.

After a predetermined time passed, inert gas is supplied from an inert gas supply source (not shown), and at the same time when the inside of the processing chamber 48 is replaced with the inert gas, the pressure of the processing chamber 48 returns to atmospheric pressure.

Thereafter, the lift motor 86 is operated to move down the seal cap 72, and at the same time when the furnace throat 70 is opened, the processed wafers 21 charged in the boat 35 are unloaded from the processing chamber 48. Then, the gate valve 98 is opened, and the processed wafers 21 are discharged from the boat 35 by the wafer transfer mechanism 27.

In the current embodiment, the processing conditions of wafers 21 in the substrate processing apparatus 20 may be as follows. For example, when an Epi-SiGe film is formed, a processing temperature may range from 400° C. to 700° C., and a processing pressure may range from 1 Pa to 200 Pa. The processing conditions may be kept constant within the above-mentioned exemplary ranges, respectively.

As described above, the gas nozzle 54 is installed to supply processing gases to the processing chamber 48, and the temperature detector 102 (described later) is installed to detect the temperature of the processing chamber 48. Each of the gas supply pipe 53 and the temperature detector 102 is an L-shaped narrow tube having a vertical part and a horizontal part, the horizontal part penetrates the inlet flange 49, and a portion of the horizontal part inserted inside the inlet flange 49 is supported by the narrow tube supporting member 55 or a narrow tube supporting member 112 (described later).

Figure 3:
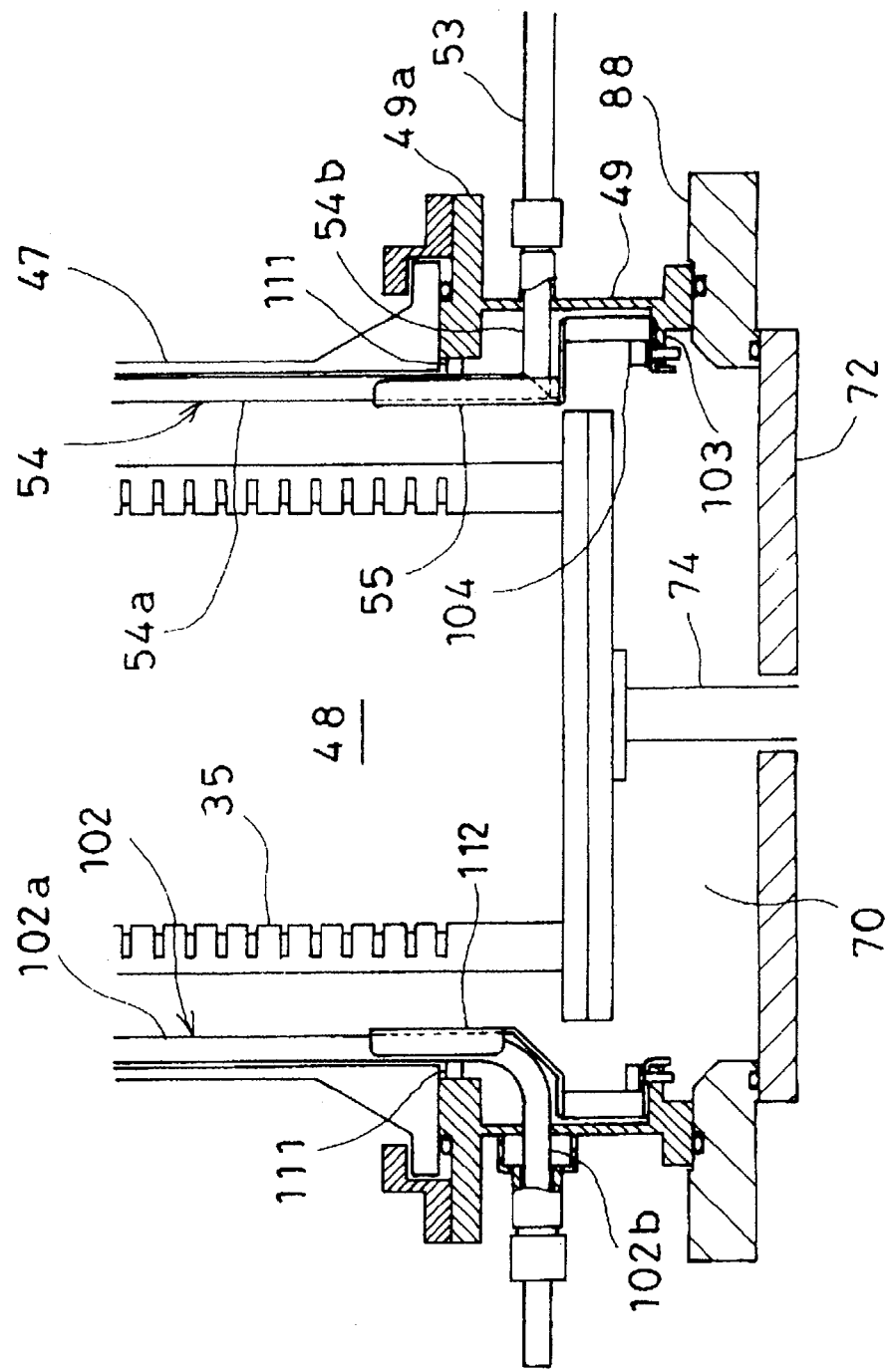
FIG. 3 is an enlarged view illustrating a furnace throat of the processing furnace.
Figure 4:
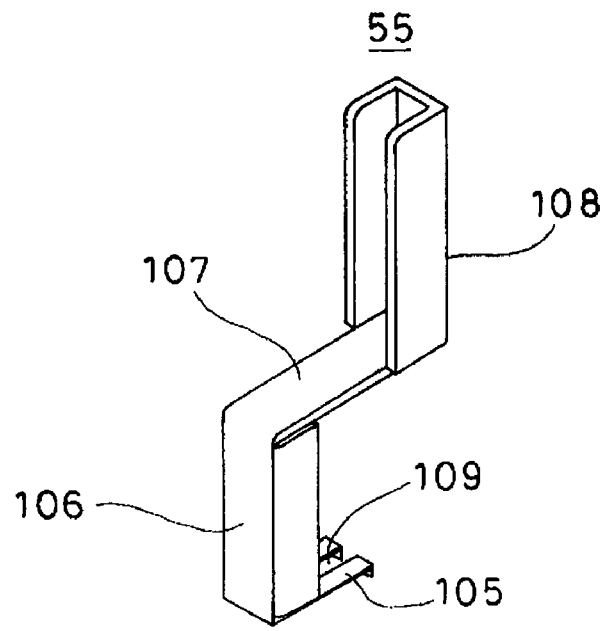
FIG. 4 is a perspective view illustrating a narrow tube supporting member used in the processing furnace.
Figure 5:
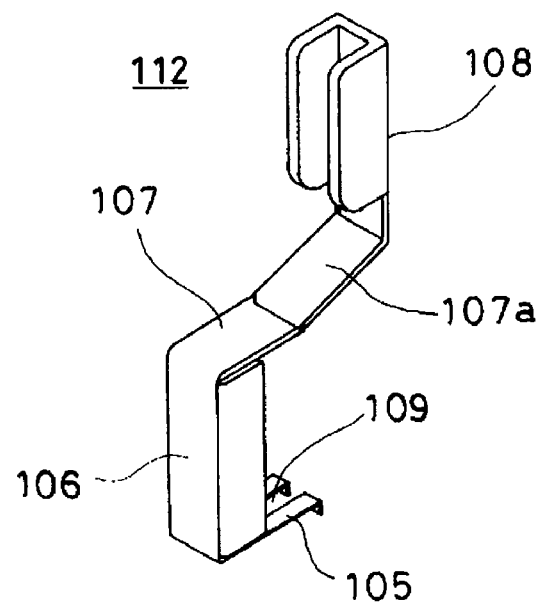
FIG. 5 is a perspective view illustrating a narrow tube supporting member used in the processing furnace.

Hereinafter, structures of supporting parts for the gas nozzle 54 and the temperature detector 102 will be described with reference to FIG. 3 to FIG. 5 in accordance with a first embodiment.

The supporting parts for the gas nozzle 54 and the temperature detector 102 have approximately the same structure. The supporting part structure for the gas nozzle 54 will be first explained.

The gas nozzle 54 is an L-shaped tube made of quartz. The gas nozzle 54 includes a vertical part 54a extending along the inner wall of the reaction tube 47 and a horizontal part 54b welded to a lower end of the vertical part 54a.

The horizontal part 54b is horizontally inserted through the inlet flange 49, and a region of the gas nozzle 54 which has an insertion portion of the horizontal part 54b disposed inside of the processing chamber 48 and the lower end of the vertical part 54a is supported by the narrow tube supporting member 55.

The narrow tube supporting member 55 will now be described with reference to FIG. 4.

An internal flange 103 protrudes inwardly from the inner circumference of the lower side of the inlet flange 49, and the narrow tube supporting member 55 is fixed to the internal flange 103 using bolts 104.

The narrow tube supporting member 55 is made of a material such as Hastelloy, stainless steel, quartz, or SiC. The narrow tube supporting member 55 includes a seat part 105 making contact with the internal flange 103, a leg part 106 standing along the inlet flange 49, a horizontal receiving part 107 formed at the upper side of the leg part 106, and a vertical receiving part 108 standing on an inner end (center-side end) of the horizontal receiving part 107.

The seat part 105 is formed with a bolt fixing hole 109, which has an elongated shape or partially cut-out shape to allow radial adjustment. The leg part 106 has a U-shaped cross-section for high strength. For the same reason, the vertical receiving part 108 has a U-shaped cross-section, and the vertical part 54a of the gas nozzle 54 can be fitted into a concave side of the vertical receiving part 108 without backlash.

An insertion portion of the vertical part 54a—that is, the lower portion of the gas nozzle 54—is in contact with the horizontal receiving part 107, so that a vertical load acting on the horizontal part 54b due to the weight of the gas nozzle 54 can be supported by the horizontal receiving part 107. Furthermore, the vertical receiving part 108 prevents the vertical part 54a from falling in two directions: an inward direction (radial direction) and a circumferential direction. In addition, the vertical receiving part 108 is used to adjust inclination of the gas nozzle 54 in the inward direction, and to prevent the gas nozzle 54 from being dislocated or pulled toward the center of the processing chamber 48 when the processing chamber 48 is at negative pressures.

Between an inner surface of an upper flange 49a of the inlet flange 49 and the vertical part 54a, a stopper 111 is disposed to form a gap between the vertical part 54a and the inner wall of the reaction tube 47. The stopper 111 may be installed at the vertical part 54a or the upper flange 49a.

In the case of installing the stopper 111 at the vertical part 54a, the same material as that used for making the vertical part 54a, such as quartz or SiC, is welded. On the other hand, in the case of installing the stopper 111 at the upper flange 49a, the same material as that used for making the upper flange 49a may be welded, or a protrusion may be machined all along the inner circumference of the upper flange 49a.

The narrow tube supporting member 55 supports the vertical load of the gas nozzle 54 and suppresses falling of the gas nozzle 54 in the radial and circumferential directions. Particularly, falling of the gas nozzle 54 in the radial direction is suppressed as follows. Since the stopper 111 forms a gap between the reaction tube 47 and the vertical part 54a, the vertical part 54a can be prevented from contacting the reaction tube 47 even when the vertical part 54a is inclined and even when the reaction tube 47 is inclined with reference to the inlet flange 49. Therefore, the horizontal part 54b does not receive a load caused by contact between the vertical part 54a and the reaction tube 47, and thus the horizontal part 54b can be prevented from being damaged.

Next, the narrow tube supporting member 112 used as a supporting part for the temperature detector 102 will be described with reference to FIG. 5. The narrow tube supporting member 55 and the narrow tube supporting member 112 have basically the same structure, and the same elements are denoted by the same reference numerals.

A narrow tube used for the temperature detector 102 is rounded at a junction between a vertical part 102a and a horizontal part 102b in order for easy insertion and removal of a thermocouple. Thus, the narrow tube supporting member 112 is shaped according to the shape of a lower part of the temperature detector 102. That is, an inclined part 107a is formed by inclining a portion of a horizontal receiving part 107, and the inclined part 107a is brought into contact with the junction, so that the interfacial pressure between the horizontal part 102b and the horizontal receiving part 107 can be reduced, and generation of bending stress at the junction can be prevented.

A vertical part 108 of the narrow tube supporting member 112 is configured to be fitted to the vertical part 102a, prevent the vertical part 102a from falling in two directions—radial and circumferential directions, and suppress movement of the vertical part 102a in a center direction, in the same way as the vertical receiving part 108 of the narrow tube supporting member 112 is configured.

With reference to FIG. 6 to FIG. 13, structures of supporting parts for the gas nozzle 54 and the temperature detector 102 will be described hereinafter in accordance with a second embodiment.

First, with reference to FIG. 6 and FIG. 8 to FIG. 11, the structure of the supporting part for the gas nozzle 54 will be explained. The same elements as those of the first embodiment are denoted by the same reference numerals, and descriptions thereof will be omitted.

Figure 6:
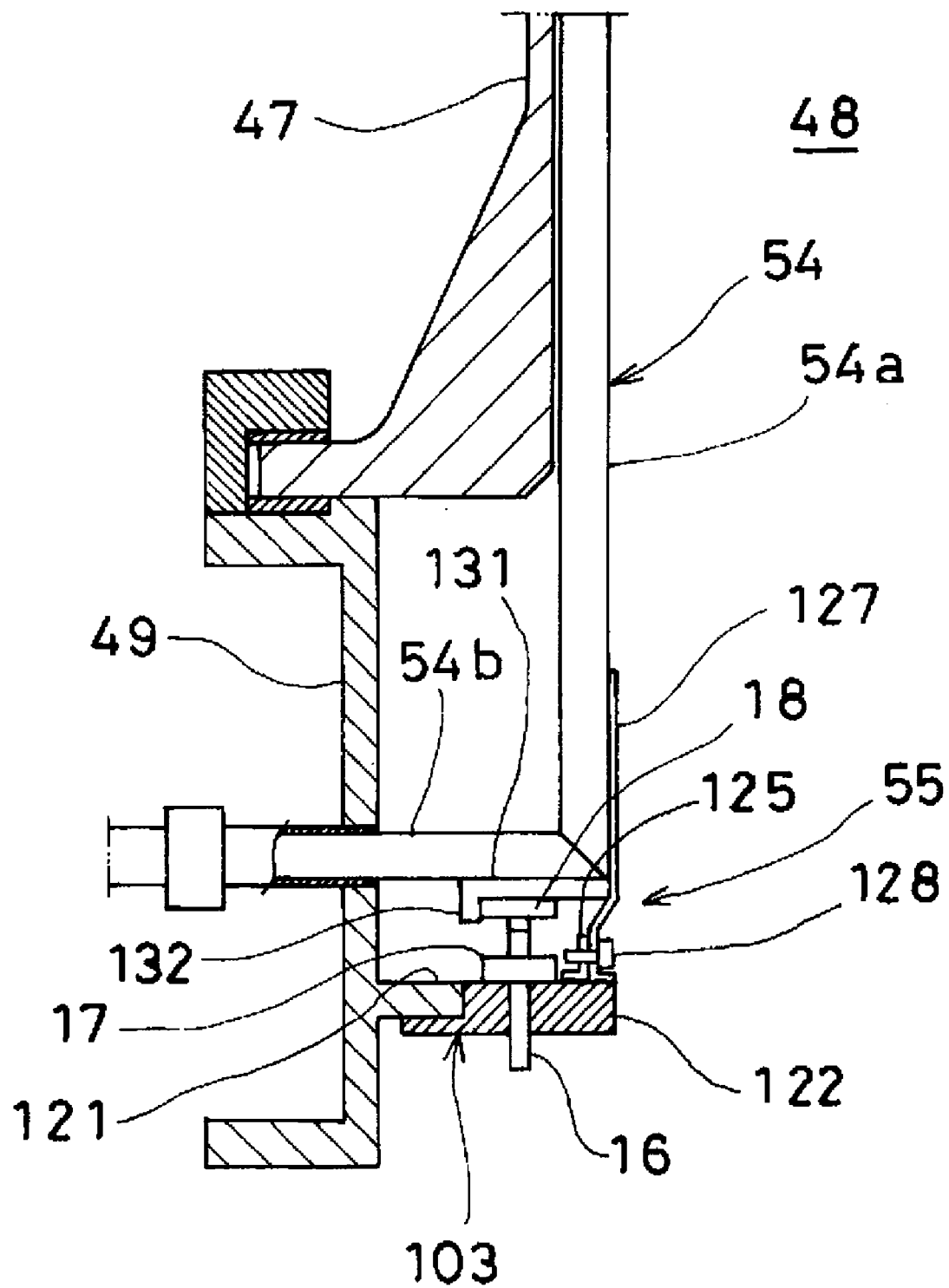
FIG. 6 is a sectional view illustrating a narrow tube supporting structure of a substrate processing apparatus in accordance with a second embodiment of the present invention.
Figure 7:
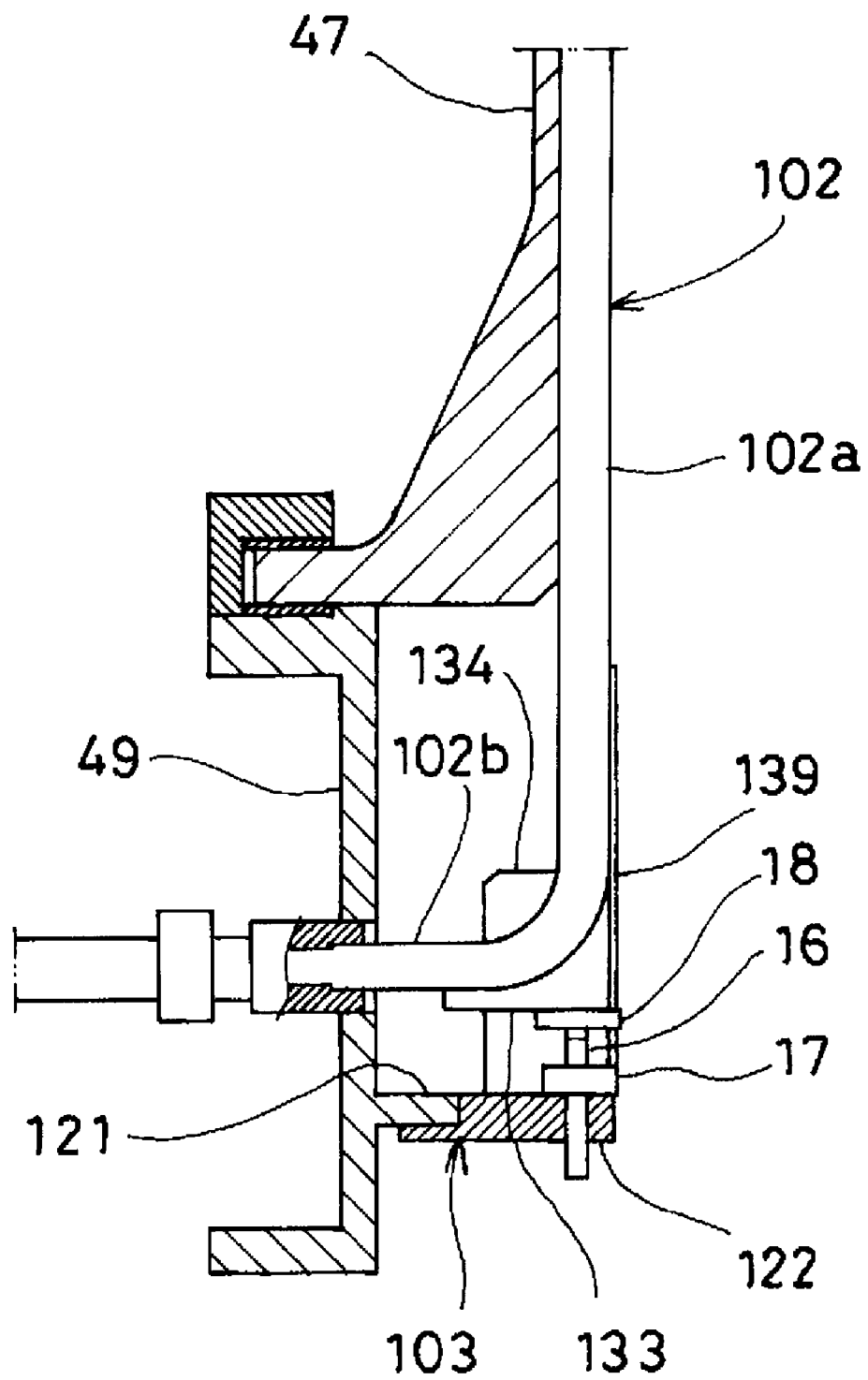
FIG. 7 is a sectional view illustrating a narrow tube supporting structure of the substrate processing apparatus.

As shown in FIG. 6, the internal flange 103 protrudes inwardly from the inner circumference of the lower side of the inlet flange 49 and has a two part structure. The internal flange 103 is configured by an inner rim 121 formed as part of the inlet flange 49 and a doughnut-shaped ring seat 122 configured to receive bolts from the bottom side of the inner rim 121.

Figure 8:
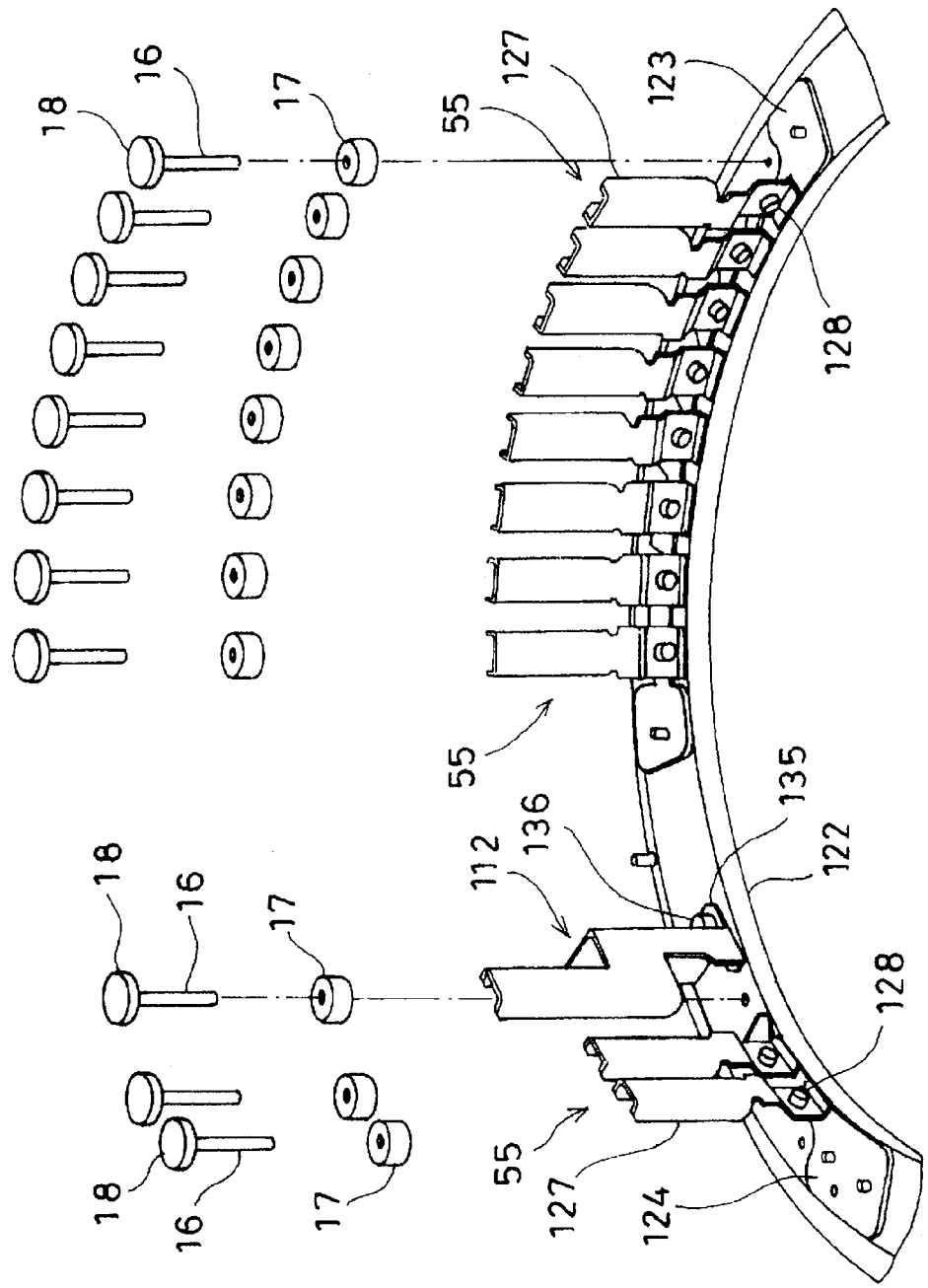
FIG. 8 is a perspective view illustrating a narrow tube supporting part of the substrate processing apparatus.
Figure 9:
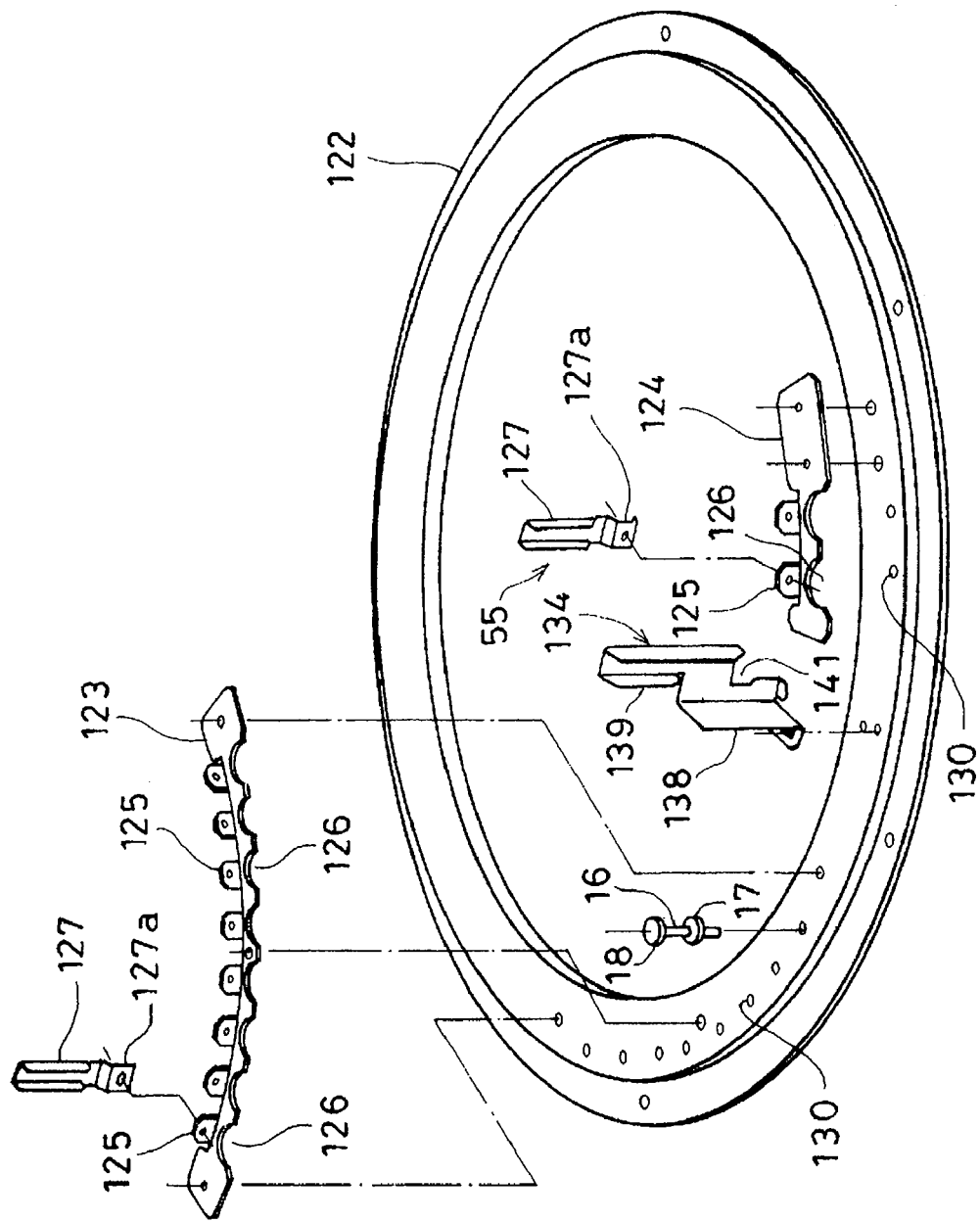
FIG. 9 is an exploded perspective view illustrating the narrow tube supporting part of the substrate processing apparatus.

As shown in FIG. 8 and FIG. 9, an A supporting member holder 123 and a B supporting member holder 124 are fixed to the ring seat 122 using bolts (not shown). Each of the A supporting member holder 123 and the B supporting member holder 124 is concentric with the ring seat 122 and includes erected tabs 125 which are arranged at predetermined intervals and bent upright. Semicircular nut relief recesses 126 are formed in correspondence with the erected tabs 125. Each of the ring seat 122, the A supporting member holder 123, and the B supporting member holder 124 is made of Hastelloy or stainless steel.

Vertical receiving parts 127 are installed at the erected tabs 125. Each of the vertical receiving parts 127 is screw-coupled by a bolt 128 horizontally inserted through a lower end part 127a of the vertical receiving part 127 in a direction from the center of the ring seat 122, and the lower end part 127a has a recessed shape to prevent the head of the bolt 128 from making contact with the boat 35 placed in the center side (of the processing chamber 48). A hole 129 of the vertical receiving part 127 through which the bolt 128 is inserted is horizontally elongated so that the horizontal position of the vertical receiving part 127 can be adjusted.

Figure 10:
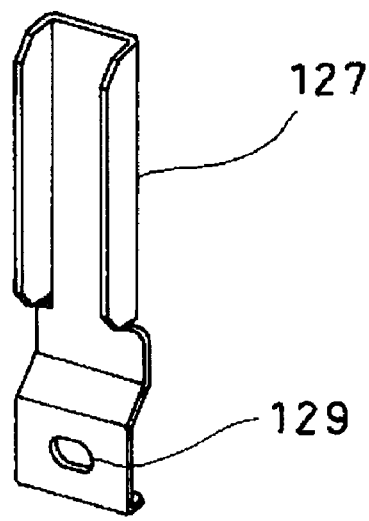
FIG. 10 is a perspective view illustrating a narrow tube supporting member for a gas nozzle in accordance with the second embodiment.
Figure 11:
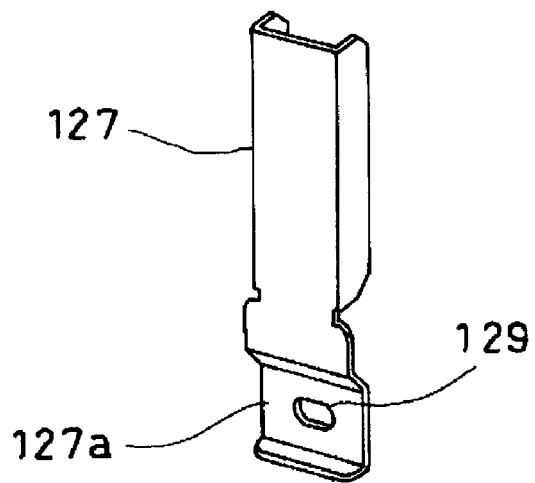
FIG. 11 is a rear perspective view illustrating the narrow tube supporting member for the gas nozzle.

As shown in FIG. 10 and FIG. 11, the vertical receiving part 127 has a U-shaped horizontal section, and the vertical part 54a of the gas nozzle 54 can be fitted into a concave side of the vertical receiving part 127 without backlash. In addition, as shown in FIG. 8, the bottom side of the lower end part 127a is bent upright so that the vertical receiving part 127 can be erected upright by bringing the bottom side of the lower end part 127a into contact with the top surface of the ring seat 122.

As shown in FIG. 8 and FIG. 9, in a state where the A supporting member holder 123 and the B supporting member holder 124 are installed at the ring seat 122, screw holes 130 are formed at positions aligned with the centers of the nut relief recesses 126 for receiving adjustment bolts 16. Lock nuts 17 are screw-coupled to the adjustment bolts 16, and each of the adjustment bolts 16 includes a nozzle receiving flange 18 having a disk shape.

At the bottom surface of the horizontal part 54b of the gas nozzle 54, a bottom seat 131 made of quartz is fixedly welded. The bottom seat 131 includes a stopper 132 at a side facing a wall of the inlet flange 49, and the stopper 132 is adapted to engage with the nozzle receiving flange 18.

The vertical receiving part 127, the adjustment bolt 16, and the lock nut 17 constitute a narrow tube supporting member 55 and are made of Hastelloy or stainless steel.

The upper end of the nozzle receiving flange 18 is brought into contact with the bottom seat 131, and while supporting the weight of the gas nozzle 54, the position of the nozzle receiving flange 18 is adjusted by rotating the adjustment bolt 16, in order to adjust the slope of the vertical part 54a in the radial direction of the reaction tube 47 for maintaining the vertical part 54a in an upright position and a proper gap between the vertical part 54a and the reaction tube 47. Furthermore, the vertical receiving part 127 is fitted to the vertical part 54a, the slope of the vertical part 54a is adjusted in the circumferential direction of the reaction tube 47 so as to place the vertical part 54a in an upright position, and the vertical receiving part 127 is firmly fixed to the erected tab 125 using the bolt 128. The upright position of the vertical part 54a can be easily adjusted by brining the lower end of the vertical part 54a into contact with the bottom seat 131, and when a plurality of vertical receiving parts 127 are installed, the assembling efficient is high because each of the vertical receiving parts 127 can be fixed to the erected tab 125 having a fixed position by using only a single bolt.

Since the nozzle receiving flange 18 is configured to be engaged with the stopper 132, the gas nozzle 54 can be prevented from being deviated or dislocated from its central position when the processing chamber 48 is at negative pressures.

The vertical receiving parts 127 are assembled as follows. The adjustment bolts 16, the A supporting member holder 123, and the B supporting member holder 124 are previously installed at the ring seat 122, and the ring seat 122 is installed at the inner rim 121 from the bottom side of the inner rim 121.

The vertical receiving parts 127 are respectively fixed to the erected tabs 125 using the bolts 128. The lower ends of the vertical receiving parts 127 are pushed against the top surface of the ring seat 122 so that the vertical receiving parts 127 can be vertically placed with respect to the ring seat 122.

Since the adjustment bolts 16, the A supporting member holder 123, and the B supporting member holder 124 are previously installed at the ring seat 122, assembling procedures in the narrow processing chamber 48 can be reduced, and the assembling efficiency can be improved.

Furthermore, since the vertical receiving parts 127 are installed at the erected tabs 125 formed at the A supporting member holder 123, the vertical receiving parts 127 can be can be installed at a low pitch, and a plurality of gas nozzles 54 can be installed at narrow intervals.

Next, a narrow tube supporting member 112 used in the supporting part for the temperature detector 102 will be described with reference to FIG. 7 to FIG. 9, FIG. 12, and FIG. 13.

A narrow tube used for the temperature detector 102 is made of quartz or SiC and is rounded at a junction between the vertical part 102a and the horizontal part 102b in order for easy insertion and removal of a thermocouple. Along the junction and the horizontal part 102b, a bottom seat 133 is welded. The bottom seat 133 is made of the same material as that used for the narrow tube such as quartz or SiC, and the bottom surface of the bottom seat 133 is horizontal.

An adjustment bolt 16 for the temperature detector 102 is inserted through the ring seat 122, and a lock nut 17 is screw-coupled to the adjustment bolt 16. By bringing the upper end of the adjustment bolt 16 into contact with the bottom surface of the bottom seat 133 and adjusting the position of a nozzle receiving flange 18 of the adjustment bolt 16 by rotating the adjustment bolt 16 while supporting the weight of the temperature detector 102, the slope of the vertical part 102a can be adjusted in the radial direction of the reaction tube 47.

Figure 12:
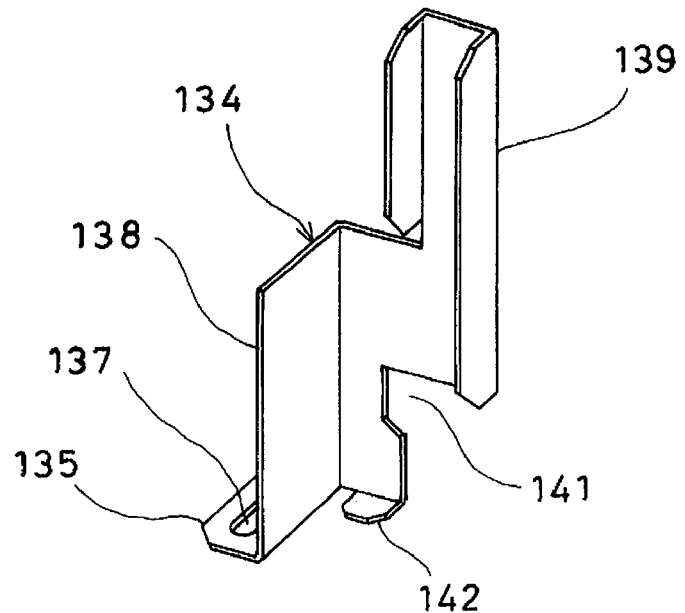
FIG. 12 is a perspective view illustrating a narrow tube supporting member for a temperature detector in accordance with the second embodiment.
Figure 13:
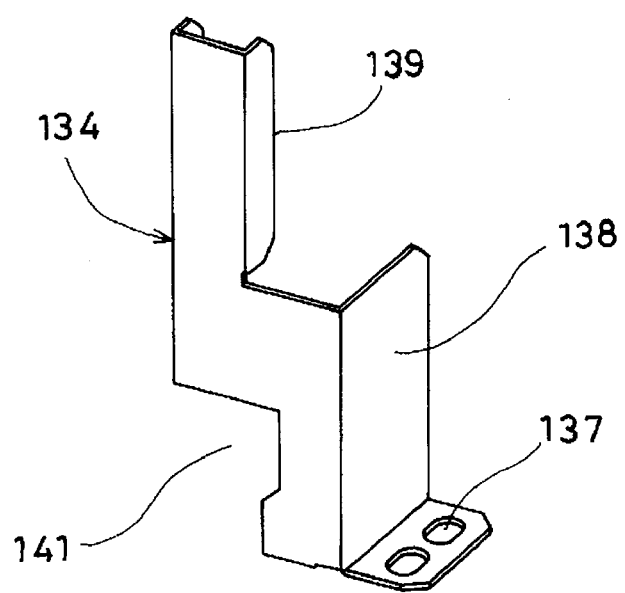
FIG. 13 is a rear perspective view illustrating the narrow tube supporting member for the temperature detector.

A temperature detector holder 134 will be explained hereinafter with reference to FIG. 12 and FIG. 13.

The temperature detector holder 134 includes a horizontally-bent seat part 135 at a lower end and is fixed to the top surface of the ring seat 122 by a bolt 136 inserted through the seat part 135. A hole 137 through which the bolt 135 is inserted is elongated in the radial direction of the processing chamber 48 so that the position of the temperature detector holder 134 can be adjusted in the radial direction of the processing chamber 48.

The temperature detector holder 134 further includes a leg part 138 and a vertical receiving part 139 extending from the leg part 138. The upper end part of the leg part 138 and the lower end part of the vertical receiving part 139 are overlapped with each other. The horizontal section of the vertical receiving part 139 and the horizontal section of the upper end part of the leg part 138 are U-shaped for high rigidity.

A cutout 141 is formed at the lower part of the leg part 138 for preventing interference with the nozzle receiving flange 18 and the lock nut 17 and allowing adjustment of the adjustment bolt 16 in a state where the temperature detector holder 134 and the adjustment bolt 16 are installed. In addition, at a side of the leg part 138 opposite to the seat part 135, a horizontally-bent tongue 142 is formed to prevent the temperature detector holder 134 from falling in the circumference direction.

The vertical receiving part 139 is fitted to the vertical part 102a of the temperature detector 102 in order to suppress falling of the vertical part 102a in two directions (radial and circumferential directions) and limit displacement of the vertical part 102a in the center direction.

The temperature detector holder 134 and the bolt 136 are formed of Hastelloy or stainless steel.

The temperature detector holder 134, the adjustment bolt 16, and the lock nut 17 constitute the narrow tube supporting member 112.

The narrow tube supporting member 112 is installed as follows. First, the adjustment bolt 16 coupled with the lock nut 17 is inserted in the ring seat 122, and the ring seat 122 is fixed to the inner rim 121 from the bottom side of the inner rim 121. By rotating the adjustment bolt 16, the nozzle receiving flange 18 is brought into contact with the bottom seat 133 and the inclination of the vertical part 102a is adjusted in the radial direction. Next, the temperature detector holder 134 is fixed to the top surface of the ring seat 122 using the bolt 136, and the vertical receiving part 139 is fitted to the vertical part 102a to adjust the inclination of the vertical part 102a in the circumferential direction.

In the narrow tube supporting member 112, the vertical receiving part 127 may be installed instead of the temperature detector holder 134. In this case, a protrusion such as the stopper 132 may be formed at the bottom surface of the bottom seat 133, and the protrusion may be engaged with the nozzle receiving flange 18.

In addition, the supporting member holder installed at the ring seat 122 may include a single erected tab 125.

According to the present invention, the substrate processing apparatus includes: a reaction tube configured to accommodate and process substrates; a substrate holder configured to hold a plurality of substrates stacked at predetermined intervals in the reaction tube; a gas nozzle installed along a stacked direction of the substrates so as to supply a predetermined processing gas to the reaction tube; a heating unit configured to heat the substrates; a temperature detector installed along the stacked direction of the substrates; and an exhaust unit configured to exhaust an inside atmosphere of the reaction tube, wherein each of the gas nozzle and the temperature detector includes a first part inserted into the reaction tube and parallel with surfaces of the stacked substrates and a second part extending from the first part along an inner wall surface of the reaction tube in the stacked direction of the substrates, and each of the gas nozzle and the temperature detector is supported by a narrow tube supporting member including a first supporting part and a second supporting part, wherein the first supporting part is in contact with the first part, and the second supporting part is parallel with the second part and is configured to be fitted the second part for supporting the second part in at least three directions. Therefore, even when the reaction tube is inclined, undesired loads are not applied to the first parts of the gas nozzle and the temperature detector. Thus, the gas nozzle and the temperature detector, and the inner wall of the reaction tube, the substrates, and the substrate holder, which face the gas nozzle or the temperature detector, can be prevented from being damaged. Furthermore, the gas nozzle and the temperature detector can be firmly fixed for preventing slippage and supporting the gas nozzle and the temperature detector securely and stably.

Furthermore, according to the present invention, the reaction tube is erected on a cylindrical inlet flange, the inlet flange includes an internal flange horizontally protruding toward a center of the inlet flange, the inlet flange has an inner diameter larger than an inner diameter of the reaction tube, and the narrow tube supporting member has a crank shape formed by a leg part parallel with an inner wall of the inlet flange, the first supporting part, and the second supporting part. Therefore, parts can be installed along the wall of the processing chamber using less space.

Furthermore, according to the present invention, the internal flange includes a detachable ring seat, the second supporting part is erected on the ring seat, and the first supporting part includes an adjustment bolt inserted in the ring seat and a narrow tube receiving flange installed at an upper end of the adjustment bolt for making contact with the first part. Therefore, the slopes of the narrow tubes can be precisely adjusted in the radial direction.

Furthermore, according to the present invention, a supporting member holder is fixed to the ring seat, the supporting member holder has an arc shape concentric with the ring seat and includes at least one vertically erected tab, and the second supporting part is adapted to be fixed to the erected tab. Therefore, the vertical receiving part can be simply installed, and the number of components and manufacturing costs can be reduced.

Furthermore, according to the present invention, the ring seat is adapted to be fixed to the internal flange from a lower side of the internal flange and is detachable from the internal flange in a state where at least the first supporting part is installed at the ring seat. Therefore, works in the narrow processing chamber can be reduced, and work efficiency can be improved.

(Supplementary Note)

The present invention also includes the following embodiments.

(Supplementary Note 1)

According to an embodiment of the present invention, there is provided a substrate processing apparatus including: a reaction tube configured to accommodate and process substrates; a substrate holder configured to hold a plurality of substrates stacked at predetermined intervals in the reaction tube; a gas nozzle installed along a stacked direction of the substrates so as to supply a predetermined processing gas to the reaction tube; a heating unit configured to heat the substrates; a temperature detector installed along the stacked direction of the substrates; and an exhaust unit configured to exhaust an inside atmosphere of the reaction tube, wherein each of the gas nozzle and the temperature detector includes a first part inserted into the reaction tube and parallel with surfaces of the stacked substrates and a second part extending from the first part along an inner wall surface of the reaction tube in the stacked direction of the substrates, and each of the gas nozzle and the temperature detector is supported by a narrow tube supporting member including a first supporting part and a second supporting part, wherein the first supporting part is in contact with the first part, and the second supporting part is parallel with the second part and is configured to support the second part in at least three directions.

(Supplementary Note 2)

In the substrate processing apparatus of Supplementary Note 1, it is preferable that the second supporting part be parallel with the second part and have a concaved cross-section.

(Supplementary Note 3)

In the substrate processing apparatus of Supplementary Note 1, it is preferable that the second supporting part have a concave cross-section so that when viewed from a direction in which the first part is inserted, rear, left, and right sides of the second part are supported by the second supporting part.

(Supplementary Note 4)

In the substrate processing apparatus of Supplementary Note 1, it is preferable that the second supporting part have a U-shaped cross-section and be adapted to be fitted to the second part, and slope of the second part be adjusted by the second supporting part in circumferential and centripetal directions.

(Supplementary Note 5)

In the substrate processing apparatus of Supplementary Note 1, it is preferable that the narrow tube supporting member be made of Hastelloy, stainless steel, quartz, which is corrosion-resistant to gas including Cl, or corrosion-resistant SiC.

(Supplementary Note 6)

In the substrate processing apparatus of Supplementary Note 1, it is preferable that the first and second supporting parts have a detachable structure, and the first supporting part be configured to adjust a supported position of the first part in a vertical direction.

(Supplementary Note 7)

In the substrate processing apparatus of Supplementary Note 1, it is preferable that the reaction tube be erected on a cylindrical inlet flange, the inlet flange include an internal flange horizontally protruding toward a center of the inlet flange, the narrow tube supporting member be installed at the internal flange, the internal flange include a detachable ring seat, the second supporting part be erected on the ring seat, and the first supporting part include an adjustment bolt inserted in the ring seat and a flange receiving a narrow flange making contact with the first part installed at an upper end of the adjustment bolt.

(Supplementary Note 8)

In the substrate processing apparatus of Supplementary Note 7, it is preferable that the inlet flange have an inner diameter larger than an inner diameter of the reaction tube, and the narrow tube supporting member have a crank shape formed by a leg part parallel with an inner wall of the inlet flange, the first supporting part, and the second supporting part.

(Supplementary Note 9)

In the substrate processing apparatus of Supplementary Note 7, it is preferable that each of the gas nozzle and the temperature detector be configured such that the second part is kept at a predetermined distance apart from the inner wall surface of the reaction tube by a stopper disposed between the inlet flange and the gas nozzle or the temperature detector.

(Supplementary Note 10)

In the substrate processing apparatus of Supplementary Note 9, it is preferable that the stoppers be welded to the gas nozzle and the temperature detector, respectively.

(Supplementary Note 11)

In the substrate processing apparatus of Supplementary Note 7, it is preferable that the narrow tube supporting member include a seat part horizontally extending to a lower end, the seat part be fixed to the internal flange by using a bolt, a bolt hole of the seat part have a radially elongated hole or partially cut-out shape, and a position of the narrow tube supporting member be adjusted in a radial direction.

(Supplementary Note 12)

In the substrate processing apparatus of Supplementary Note 7, it is preferable that a supporting member holder be fixed to the ring seat, the supporting member holder include an erected tab which is vertically bent, and the second supporting part be fixed to the erected tab.

(Supplementary Note 13)

In the substrate processing apparatus of Supplementary Note 7, it is preferable that a supporting member holder be fixed to the ring seat, the supporting member holder have a concentric arc shape to the ring seat and include at least one vertically erected tab, and the second supporting part be adapted to be fixed to the erected tab.

(Supplementary Note 14)

In the substrate processing apparatus of Supplementary Note 7, it is preferable that a supporting member holder be fixed to the ring seat, the supporting member holder have a concentric arc shape to the ring seat and include a plurality of vertically erected tabs, and the second supporting parts be adapted to be fixed to the erected tabs, respectively.

(Supplementary Note 15)

In the substrate processing apparatus of Supplementary Note 7, it is preferable that the ring seat be adapted to be fixed to the internal flange from a lower side of the internal flange and be detachable from the internal flange in a state where at least the first supporting part is installed at the ring seat.

(Supplementary Note 16)

In the substrate processing apparatus of Supplementary Note 7, it is preferable that the ring seat be adapted to be fixed to the internal flange from a lower side of the internal flange and be detachable from the internal flange in a state where the first supporting part and the second supporting part are installed at the ring seat.

(Supplementary Note 17)

In the substrate processing apparatus of Supplementary Note 12, it is preferable that the second supporting part be fixed to the erected tab by using a bolt, and the second supporting part include a horizontally elongated bolt penetration hole to allow adjustment of a horizontal position of the second supporting part.

What is claimed is:

1. A substrate processing apparatus comprising:
   a reaction tube configured to accommodate and process substrates;

a substrate holder configured to hold a plurality of substrates stacked at predetermined intervals in the reaction tube;
a gas nozzle installed along a stacked direction of the substrates so as to supply a predetermined processing gas to the reaction tube;
a heating unit configured to heat the substrates;
a temperature detector installed along the stacked direction of the substrates; and
an exhaust unit configured to exhaust an inside atmosphere of the reaction tube,
wherein each of the gas nozzle and the temperature detector comprises a first part inserted into the reaction tube and parallel with surfaces of the stacked substrates and a second part extending from the first part along an inner wall surface of the reaction tube in the stacked direction of the substrates, and
each of the gas nozzle and the temperature detector is supported by a narrow tube supporting member comprising a first supporting part and a second supporting part,
wherein the first supporting part is in contact with the first part, and the second supporting part is parallel with the second part and is configured to support the second part in at least three directions.

2. The substrate processing apparatus of claim 1, wherein the second supporting part is parallel with the second part and has a concaved cross-section.

3. The substrate processing apparatus of claim 1, wherein the second supporting part has a concave cross-section so that when viewed from a direction in which the first part is inserted, rear, left, and right sides of the second part are supported by the second supporting part.

4. The substrate processing apparatus of claim 1, wherein the second supporting part has a U-shaped cross-section and is adapted to be fitted to the second part, and
slope of the second part is adjusted by the second supporting part in circumferential and centripetal directions.

5. The substrate processing apparatus of claim 1, wherein the narrow tube supporting member is made of Hastelloy, stainless steel, quartz, which is corrosion-resistant to gas including Cl, or corrosion-resistant SiC.

6. The substrate processing apparatus of claim 1, wherein the first and second supporting parts have a detachable structure, and the first supporting part is configured to adjust a supported position of the first part in a vertical direction.

7. The substrate processing apparatus of claim 1, wherein the reaction tube is erected on a cylindrical inlet flange, the inlet flange comprises an internal flange horizontally protruding toward a center of the inlet flange, the narrow tube supporting member is installed at the internal flange, the internal flange comprises a detachable ring seat, the second supporting part is erected on the ring seat, and the first supporting part comprises an adjustment bolt inserted in the ring seat and a flange receiving a narrow tube making contact with the first part installed at an upper end of the adjustment bolt.

8. The substrate processing apparatus of claim 7, wherein the inlet flange has an inner diameter larger than an inner diameter of the reaction tube, and
the narrow tube supporting member has a crank shape formed by a leg part parallel with an inner wall of the inlet flange, the first supporting part, and the second supporting part.

9. The substrate processing apparatus of claim 7, wherein each of the gas nozzle and the temperature detector is configured such that the second part is kept at a predetermined distance apart from the inner wall surface of the reaction tube by a stopper disposed between the inlet flange and the gas nozzle or the temperature detector.

10. The substrate processing apparatus of claim 9, wherein the stoppers are welded to the gas nozzle and the temperature detector, respectively.

11. The substrate processing apparatus of claim 7, wherein the narrow tube supporting member comprises a seat part horizontally extending to a lower end, the seat part is fixed to the internal flange by using a bolt, a bolt hole of the seat part has a radially elongated hole or partially cut-out shape, and a position of the narrow tube supporting member is adjusted in a radial direction.

12. The substrate processing apparatus of claim 7, wherein a supporting member holder is fixed to the ring seat, the supporting member holder comprises an erected tab which is vertically bent, and the second supporting part is fixed to the erected tab.

13. The substrate processing apparatus of claim 7, wherein a supporting member holder is fixed to the ring seat, the supporting member holder has a concentric arc shape to the ring seat and comprises at least one vertically erected tab, and the second supporting part is adapted to be fixed to the erected tab.

14. The substrate processing apparatus of claim 7, wherein a supporting member holder is fixed to the ring seat, the supporting member holder has a concentric arc shape concentric to the ring seat and comprises a plurality of vertically erected tabs, and the second supporting parts are adapted to be fixed to the erected tabs, respectively.

15. The substrate processing apparatus of claim 7, wherein the ring seat is adapted to be fixed to the internal flange from a lower side of the internal flange and is detachable from the internal flange in a state where at least the first supporting part is installed at the ring seat.

16. The substrate processing apparatus of claim 7, wherein the ring seat is adapted to be fixed to the internal flange from a lower side of the internal flange and is detachable from the internal flange in a state where the first supporting part and the second supporting part are installed at the ring seat.

17. The substrate processing apparatus of claim 12, wherein the second supporting part is fixed to the erected tab by using a bolt, and the second supporting part comprises a horizontally elongated bolt penetration hole to allow adjustment of a horizontal position of the second supporting part.

* * * * *